(12) United States Patent
Mahler et al.

(10) Patent No.: US 9,165,847 B2
(45) Date of Patent: Oct. 20, 2015

(54) SEMICONDUCTOR DEVICE INCLUDING A MATERIAL TO ABSORB THERMAL ENERGY

(71) Applicant: Infineon Technologies Austria AG, Villach (AT)

(72) Inventors: Joachim Mahler, Regensburg (DE); Ralf Otremba, Kaufbeuren (DE); Khalil Hosseini, Weihmichl (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/866,150

(22) Filed: Apr. 19, 2013

(65) Prior Publication Data

US 2014/0312394 A1  Oct. 23, 2014

(51) Int. Cl.
| | |
|---|---|
| H01L 23/427 | (2006.01) |
| H01L 23/28 | (2006.01) |
| H01L 21/56 | (2006.01) |
| H01L 23/31 | (2006.01) |
| H01L 23/36 | (2006.01) |
| H01L 23/42 | (2006.01) |
| H01L 23/495 | (2006.01) |
| H01L 23/498 | (2006.01) |

(52) U.S. Cl.
CPC ............... *H01L 23/28* (2013.01); *H01L 21/56* (2013.01); *H01L 23/3107* (2013.01); *H01L 23/3121* (2013.01); *H01L 23/3171* (2013.01); *H01L 23/36* (2013.01); *H01L 23/42* (2013.01); *H01L 23/49562* (2013.01); *H01L 23/49582* (2013.01); *H01L 23/49894* (2013.01); *H01L 2924/0002* (2013.01)

(58) Field of Classification Search
CPC .................. H01L 23/4275; H01L 2924/12044
USPC .............. 257/40, 48, 922, E23.089, E23.112
See application file for complete search history.

(56) References Cited

U.S. PATENT DOCUMENTS

| | | | |
|---|---|---|---|
| 5,224,356 A * | 7/1993 | Colvin et al. ................ 62/259.2 |
| 6,552,109 B1 * | 4/2003 | Chen .......................... 524/270 |
| 6,703,128 B2 * | 3/2004 | Myers et al. .................. 428/403 |
| 7,220,987 B2 * | 5/2007 | Kuroda et al. .................. 257/40 |
| 2007/0077522 A1 * | 4/2007 | Satoh et al. ............. 430/270.11 |
| 2010/0038053 A1 * | 2/2010 | Maxik et al. ................. 165/80.2 |

* cited by examiner

*Primary Examiner* — John C Ingham
(74) *Attorney, Agent, or Firm* — Murphy, Bilak & Homiller, PLLC

(57) ABSTRACT

A semiconductor device includes a semiconductor chip and a first material including molecules that are configured to absorb thermal energy by reversibly changing a spatial molecular structure of the molecules.

19 Claims, 4 Drawing Sheets

SEMICONDUCTOR DEVICE INCLUDING A MATERIAL TO ABSORB THERMAL ENERGY

TECHNICAL FIELD

The disclosure relates to semiconductor devices including a material to absorb thermal energy. The disclosure further relates to methods for manufacturing such semiconductor devices.

BACKGROUND

Semiconductor devices and methods for manufacturing semiconductor devices constantly have to be improved. Semiconductor devices may heat up during their operation for many different reasons. For example, high energetic short time pulses may increase the temperature of a semiconductor device. It may be desirable to reduce the impact of heat in semiconductor devices during operation. In particular, it may be desirable to avoid damage of the semiconductor devices that may be caused by increased temperatures occurring in the semiconductor devices.

SUMMARY

In an embodiment, a semiconductor device includes a semiconductor chip and a first material including molecules that are configured to absorb thermal energy by reversibly changing a spatial molecular structure of the molecules.

In another embodiment, a method for manufacturing a semiconductor device includes providing a semiconductor chip and providing a first material including molecules that are configured to absorb thermal energy by reversibly changing a spatial molecular structure of the molecules.

In another embodiment, a semiconductor device includes a power semiconductor chip including a first surface and a second surface opposite the first surface, wherein the first surface includes a drain, and the second surface includes a gate and a source and a material arranged over second surface, and wherein the material includes molecules that are configured to absorb thermal energy by reversibly changing a spatial molecular structure of the molecules.

BRIEF DESCRIPTION OF THE DRAWINGS

The accompanying drawings are included to provide a further understanding of aspects and are incorporated in and constitute a part of this specification. The drawings illustrate aspects and together with the description serve to explain principles of aspects. Other aspects and many of the intended advantages of aspects will be readily appreciated as they become better understood by reference to the following detailed description. The elements of the drawings are not necessarily to scale relative to each other. Like reference numerals may designate corresponding similar parts.

DETAILED DESCRIPTION

Figure 1:
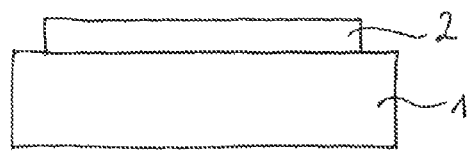
FIG. 1 schematically illustrates a cross-sectional view of a semiconductor device according to an embodiment.

In the following detailed description, reference is made to the accompanying drawings, which form a part hereof, and in which is shown by way of illustration specific aspects in which the disclosure may be practiced. In this regard, directional terminology, such as "top," "bottom," "front," "back," etc., may be used with reference to the orientation of the figures being described. Since components of described devices may be positioned in a number of different orientations, the directional terminology may be used for purposes of illustration and is in no way limiting. It is understood that other aspects may be utilized and structural or logical changes may be made without departing from the scope of the present disclosure. The following detailed description, therefore, is not to be taken in a limiting sense, and the scope of the present disclosure is defined by the appended claims.

Semiconductor devices and methods for manufacturing such semiconductors devices are described herein. It is understood that comments made in connection with a described semiconductor device may also hold true for a corresponding method and vice versa. For example, if a specific component of a semiconductor device is described, a corresponding method for manufacturing the semiconductor device may include a step of providing the component in a suitable manner, even if such method step is not explicitly described or illustrated in the figures. In addition, it is understood that the features of the various exemplary aspects described herein may be combined with each other, unless specifically noted otherwise.

As employed in this specification, the terms "coupled" and/or "electrically coupled" are not meant to mean that the elements must be directly coupled together. Intervening elements may be provided between the "coupled" or "electrically coupled" elements.

The semiconductor devices described herein may include one or more semiconductor chips. The semiconductor chips may be of different types, may be manufactured by different technologies and may include, for example, integrated electrical, electro-optical or electro-mechanical circuits or passives. The integrated circuits may, for example, be designed as logic integrated circuits, analog integrated circuits, mixed signal integrated circuits, power integrated circuits, memory circuits or integrated passives. In addition, the semiconductor chips may be configured as so-called MEMS (Micro-Electro Mechanical Systems) and may include micro-mechanical structures, such as bridges, membranes or tongue structures. The semiconductor chips need not be manufactured from a specific semiconductor material, for example, Si, SiC, SiGe, GaAs, GaN, and also may include inorganic and/or organic materials that are not semiconductors, such as, for example, insulators, plastics or metals. In addition, the semiconductor chips may be packaged or unpackaged.

For example, the semiconductor chips may include a power semiconductor. Such semiconductor chips may have a vertical structure, i.e. the semiconductor chips may be fabricated such that electric currents may flow in a direction perpendicular to the main faces of the semiconductor chips. A semiconductor chip having a vertical structure may have electrodes on its two main faces, i.e. on its top side and bottom side. In particular, power semiconductor chips may have a vertical structure and may have load electrodes on both main faces. The vertical power semiconductor chips may, for example, be configured as power MOSFETs (Metal Oxide Semiconductor Field Effect Transistors), IGBTs (Insulated Gate Bipolar Transistors), JFETs (Junction Gate Field Effect Transistors) or power bipolar transistors. For example, the source electrode and gate electrode of a power MOSFET may be located on one face, while the drain electrode of the power MOSFET may be arranged on the other face. In addition, the semiconductor devices described herein may include integrated circuits to control the integrated circuits of the power semiconductor chips.

The semiconductor chips may have contact pads (or contact elements or contact terminals or contact electrodes) which may allow electrical contact to be made with integrated circuits included in the semiconductor chips. For the case of a power semiconductor chip, a contact pad may e.g. correspond to a gate electrode or a source electrode. The contact pads may include one or more metal layers that may be applied to the semiconductor material. The metal layers may be manufactured with any desired geometric shape and any desired material composition. For example, the contact pads may include any suitable metal or metal alloy, for example at least one of aluminum, titanium, gold, silver, copper, palladium, platinum, nickel, chromium, nickel vanadium, etc.

The semiconductor devices described herein may include a carrier, over (or on) which a semiconductor chip may be arranged. The carrier may be manufactured of at least one of a metal, an alloy, a dielectric, a plastic, a ceramic, etc. The carrier may have a homogeneous structure, but may also provide internal structures like conducting paths with an electric redistribution function. Examples for such carriers are a die pad, a lead frame including a die pad, or a ceramic substrate including one or more redistribution layers.

The semiconductor devices described herein may include an encapsulation material that may at least partly cover one or more components of the semiconductor devices, for example a semiconductor chip included therein. The encapsulation material may be electrically insulating and may form an encapsulation body. For example, the encapsulation material may include any appropriate duroplastic, thermoplastic or thermosetting material, mold compound, or laminate (prepreg). Various techniques may be used for encapsulating one or more semiconductor chips with the encapsulation material, for example at least one of compression molding, injection molding, powder molding, liquid molding, and lamination.

The semiconductor devices described herein may include a passivation layer that may be a part of a semiconductor chip. The passivation layer may be made of or may include at least one of silicon nitride, silicon oxide, $Al_2O_3$, aC:H, DLC, and a polymer. For example, contact pads may be embedded in the passivation layer providing an electrical connection to integrated circuits of the semiconductor chip. The passivation layer may particularly cover the front side of the semiconductor chip. That is, the passivation layer may be arranged over a main surface of the semiconductor chip including integrated circuits. The integrated circuits may be manufactured by doping, ion implantation, deposition of materials, photolithographic patterning, etc. Hence, the passivation layer may particularly be configured to protect inner electronic structures of the semiconductor chip from damage.

The semiconductor devices described herein may include a redistribution layer that may include one or more electrically conductive layers (e.g. made of or including a metal and/or a metal alloy) and one or more electrically insulating layers. The electrically conductive layers may be used as wiring layers to make electrical contact with a semiconductor chip from outside the semiconductor device and/or to make electrical contact with other semiconductor chips and/or components contained in the semiconductor device and/or for heat dissipating purposes. The electrically conductive layers may couple contact elements of the semiconductor chips to external contact elements. The redistribution layer may thus particularly be arranged over a main surface of a semiconductor chip including electrical contacts. The electrically conductive layers may have further properties as well, for example they may be used as ground or electrical shielding layers. The electrically insulation layers may be configured to electrically insulate the electrically conductive layers from one another.

The semiconductor devices described herein may include a material configured to absorb thermal energy by reversibly changing a spatial molecular structure of the molecules. In the following, such material may also be referred to as material for reversibly absorbing thermal energy. Since the absorption of thermal energy is reversible, the absorption may be seen as a temporary storage of thermal energy during a finite time interval. The material for reversibly absorbing thermal energy may be arranged in the semiconductor devices at various positions, in various concentrations, in various geometrical forms, etc. as will become apparent below. For example, the material for reversibly absorbing thermal energy may be used in a pure form or may be included or embedded in at least one of a passivation layer, a redistribution layer, an encapsulation layer, etc.

The bond energies (or the sum of the bond energies) between the atoms of a molecule of the material for reversibly absorbing thermal energy may change from a first molecular structure of the molecule to a second molecular structure of the molecule. The difference between the bond energies before and after changing the molecular structure may correspond to a thermal energy that may be absorbed by the molecule. In other words, thermal energy may be converted to bond energy stored in the molecules during the absorption (or storage) process. For example, the material for reversibly absorbing thermal energy may absorb thermal energy that may occur during an operation of a semiconductor device. Since the process of absorbing the thermal energy is reversible, the absorbed thermal energy may be released at a later time by changing the molecular structure of the molecule from the second molecular structure of the molecule to another molecular structure of the molecule, for example the previous first molecular structure of the molecule.

Thermal energy may e.g. be absorbed by a transition from a first isomer of the molecules to a second isomer of the molecules. Isomers may be specified as compounds having an identical molecular formula but different structural formulas. Various classes of isomers may be employed for providing the material for reversibly absorbing thermal energy. In one example, thermal energy may be absorbed by a transition from a first configurational isomer of the molecules to a second configurational isomer of the molecules. In another example, thermal energy may be absorbed a transition from a first conformational isomer of the molecules to a second conformational isomer of the molecules. In general, any possible transition between isomers may used, wherein the employed isomers generally may be classified as constitutional (structural) isomers, stereoisomers (spatial isomers), enantiomers, diastereomers, cis-trans isomers, conformers, rotamers, etc. It is noted that the molecules of the material for reversibly absorbing thermal energy are not necessarily restricted to one specific isomeric type. That is, thermal energy may also be absorbed by employing multiple different transitions between isomers of the molecules. For example, a material may be provided in which transitions between different configurational isomers as well as transitions between different conformational isomers may be possible for absorbing thermal energy.

Specific examples for molecules that may be included in a material for reversibly absorbing thermal energy are specified in the following. It is noted that the material is not restricted to include only one of these materials. It may also be possible that the material includes any of various combinations of the specified materials based on corresponding mixing ratios for the included materials.

In one example, the material for reversibly absorbing thermal energy includes a 1-ethyl-4-[4-methoxystyryl]-quinolinium compound, wherein an activation energy of an exemplary reversible cis-trans isomerization (or cis-trans rearrangement)

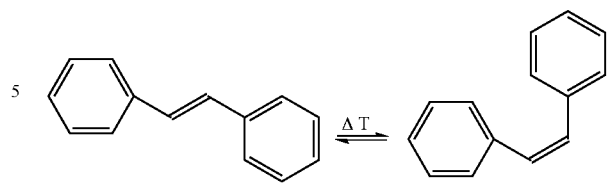

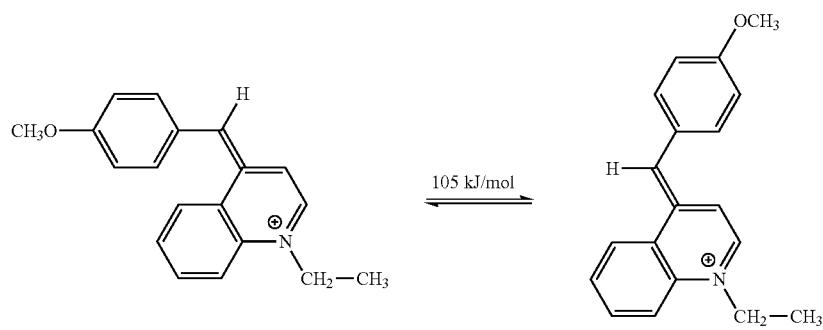

may be about 25 kcal/mol (or about 105 kJ/mol). The molecular weight of this compound may be about 289 g/mol such that 289 g of the compound may be configured to absorb an energy of about 105 kJ. Alternatively or additionally, the material for reversibly absorbing thermal energy includes at least one of a cis-stilbazolium betaine, an N,N-dialkylamino-styrene dye, etc., in some embodiments.

A high-energy short-time pulse, e.g. in the form of a so-called "Single Avalanche Pulse", may occur in a semiconductor device. Said pulse may have a maximum energy of about 130 mJ, such that about 0.358 mg of the 1-ethyl-4-[4-methoxystyryl]-quinolinium compound may be used to absorb this maximum energy for a time period before releasing the maximum energy again. To ensure a complete absorption of the maximum energy, the required mass of about 0.358 mg of the 1-ethyl-4-[4-methoxystyryl]-quinolinium compound may be multiplied by an additional factor of, e.g., 10, such that an amount of about 4 mg of the 1-ethyl-4-[4-methoxystyryl]-quinolinium compound may be used for absorbing the thermal energy. Any other suitable factor (e.g. smaller than 10, greater than 10, etc.) may be employed for determining the actually used amount of material for reversibly absorbing thermal energy. The determined amount of the material may be arranged in the semiconductor device in various ways as will become apparent below.

In a further example, the material for reversibly absorbing thermal energy may include a stilbene. An exemplary transition between two stilbene isomers may be expressed by Non-substituted stilbene may include a cis-stilbene at about 23° C. (see compound on the left) that may change to a trans-stilbene (see compound on the right) at a temperature of about 125° C. Here, a molar enthalpy of formation may be about 136.7 kJ/mol, i.e. a thermal energy of about 136.7 kJ/mol may be absorbed by one mol of the stilbene from the environment.

The exemplary isomerization temperature of 125° C. of the specified stilbene may be varied by employing one or more substituents. Such molecules may provide a phase transition at specific temperatures from a solid state to a liquid state such that additional thermal energy may be absorbed from the environment. An exemplary transition between two stilbene isomers including a substituent R may be expressed by

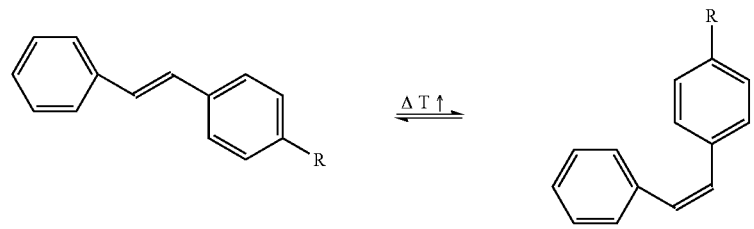

wherein the isomerization temperature may be increased, i.e. may be greater than 125° C. Possible substituents are R=—OCH$_3$, —NO$_2$, for example.

In further examples, the material for reversibly absorbing thermal energy may include at least one of: a porphyrin, a norbornadiene, a spiro compound, and an azo compound.

The molecules of the material for reversibly absorbing thermal energy may be grouped in particles (or clusters or agglomerations) with each particle including multiple molecules. Each particle may be coated by a material that may include at least one of: a polyimide, a silane, a silicone, an epoxide, an acrylic resin, and mixtures thereof. The coating of a particle may protect the contained molecules from reacting with further materials of the semiconductor device. In addition, the coating may enclose the molecules such that particles with a specific diameter may be obtained. The diameter of the particles may vary and may particularly depend on how and where the material for reversibly absorbing thermal energy is used in the semiconductor device. For example, the diameter of the particles may substantially equal the diameter of the material in which the particles may be embedded. The material for reversibly absorbing thermal energy may e.g. be embedded in an encapsulation material. In this case, the material may include particles having a diameter ranging from about 5 µm (micrometers) to about 100 µm (micrometers). In a further example, the material for reversibly absorbing thermal energy may be arranged over (or on) one or more surfaces of a semiconductor chip. In this case, the material may include particles having a diameter ranging from about 100 nanometers to about 20 µm (micrometers).

FIG. 1 schematically illustrates a cross-sectional view of a semiconductor device 100 in accordance with the disclosure. The semiconductor device 100 may include a semiconductor chip 1 and a material 2. The material 2 may include molecules that may be configured to absorb thermal energy by reversibly changing a spatial molecular structure of the molecules. The device 100 may include further components which are not illustrated. More detailed devices similar to the device 100 are described below. The arrangement of the material 2 in FIG. 1 is exemplary. Various possibilities for arranging and providing the first material 2 are described below.

During operation, the semiconductor device 100 may heat up in various ways. Associated temperature changes may differ in their magnitude, in their initial temperature, in their final temperature, in their location, in their time duration, etc.

For example, one or more high energetic short time pulses may occur at specific locations in the semiconductor device 100 such that the temperature of the semiconductor device 100 may increase in the vicinity of these specific locations. For example, the temperature at a specific location may increase e.g. about 200° C. in e.g. about 1 millisecond. Such high energetic short time pulse may e.g. occur in form of a Single Avalanche Pulse at a surface of the semiconductor device 100. In the case of a power semiconductor chip, high energetic short time pulses may particularly occur at a surface of the semiconductor chip including a gate and a source. Here, the high energetic short time pulse may particularly heat up the upper 5 µm (micrometers) of the semiconductor material.

In a further example, the semiconductor device 100 may heat up during a common operation for longer time intervals. This may result in a smaller increase of temperature compared to the case of high energetic short time pulses. For example, the temperature of the semiconductor device may increase by a value lying in a range from e.g. about 20° C. to about 100° C. in e.g. about multiple seconds or multiple minutes. Such smaller and slower temperature changes may not only occur at specific locations in the semiconductor device 100, but also in larger regions or even throughout the whole semiconductor device 100.

Generally, increases in temperature may lie in a range from about 150° to about 400° C., and more particularly in a range from about 150° C. to about 250° C. During such temperature changes, molecules of the material 2 for reversibly absorbing thermal energy may reversibly change their molecular spatial structure and absorb thermal energy that has been generated. For example, the thermal energy may be absorbed when a predetermined activation energy or a predetermined temperature depending on the type of the used material is reached at which a change of the molecular structure may become possible.

Due to the absorption of thermal energy, the semiconductor device 100 may operate at lower temperatures compared to a semiconductor device not including the material 2. In other words, using the material 2 may result in a cooling of the semiconductor device 100 during its operation. When the temperature falls below a predetermined temperature after the thermal energy has been stored, the molecular structure of the molecules may change to another arrangement, for example the molecular structure that was existent before the increase of temperature. The stored thermal energy may then at least partly be released such that the material 2 may be configured to absorb thermal energy for a subsequent increase in temperature.

Figure 2A:
FIGS. 2A and 2B schematically illustrate a cross-sectional view of a method for manufacturing a semiconductor device according to an embodiment.
Figure 2B:
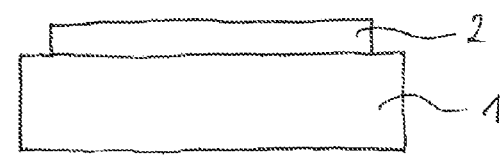

FIGS. 2A and 2B schematically illustrate a cross-sectional view of a method for manufacturing a semiconductor device 200 according to an embodiment. In particular, the method may be used to manufacture the semiconductor device 100 of FIG. 1 such that comments made in connection with FIG. 1 may also hold true for FIGS. 2A and 2B.

In a first step (see FIG. 2A), a semiconductor chip 1 may be provided. In a second step (see FIG. 2B), a material 2 may be provided that may include molecules that may be configured to absorb thermal energy by reversibly changing a spatial molecular structure of the molecules. The method may include additional steps, for example manufacturing further components of the semiconductor device 200. Methods for manufacturing more detailed semiconductor devices similar to the semiconductor device 200 become apparent from the following specification.

Figure 3:
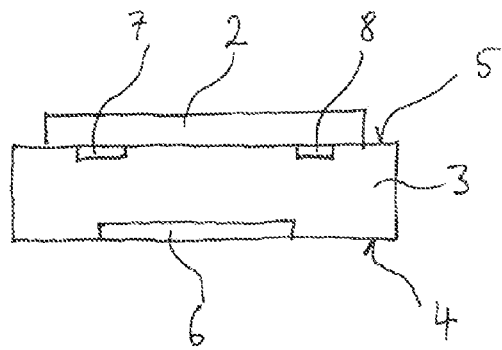
FIG. 3 schematically illustrates a cross-sectional view of a semiconductor device according to an embodiment.

FIG. 3 schematically illustrates a cross-sectional view of a semiconductor device 300 in accordance with an embodiment. The semiconductor device 300 may be similar to the semiconductor device 100 of FIG. 1 and may be manufactured based on a method similar to the method of FIGS. 2A and 2B. Comments made in connection with FIGS. 1, 2A and 2B thus may also hold true for FIG. 3.

The semiconductor device 300 may include a power semiconductor chip 3 having a first surface 4 and a second surface 5 opposite the first surface 4. The first surface 4 may include a drain 6 while the second surface 5 may include a gate 7 and a source 8. The semiconductor device 300 may further include a material 2 arranged over the second surface 5, wherein the material 2 may include molecules that may be configured to absorb thermal energy by reversibly changing a spatial molecular structure of the molecules. The semiconductor device 300 may include further components which are not illustrated. More detailed devices similar to the device 300 are described in the following.

Figure 4A:
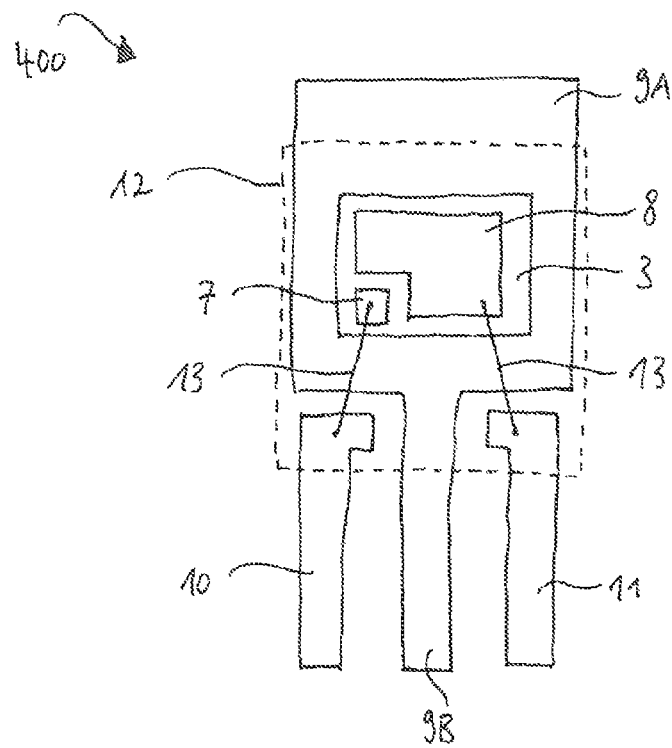
FIG. 4A schematically illustrates a top plan view of a semiconductor device according to an embodiment.
Figure 4B:
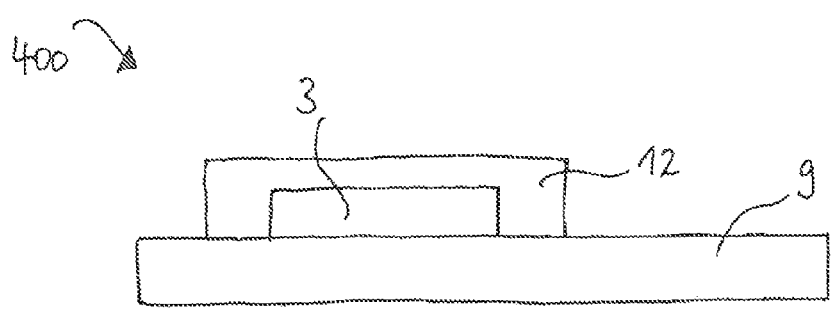
FIG. 4B schematically illustrates a cross-sectional view of the semiconductor device according to an embodiment.

FIG. 4A schematically illustrates a top plan view of a semiconductor device 400. FIG. 4B illustrates the semiconductor device 400 in a cross-sectional side view. FIG. 4B does not necessarily show all components of the device 400 due to the chosen perspective. FIGS. 4A and 4B are meant to support an understanding of semiconductor devices in accordance with the disclosure. Comments made in connection with FIGS. 4A and 4B may also hold true for semiconductor devices in accordance with the disclosure described herein.

The semiconductor device 400 may include a carrier 9 having a die pad 9A that may at least partly be made of an electrically conductive material, for example a metal or a metal alloy. In addition, the carrier 9 may be manufactured to have a contact element 9B having the form of a terminal leg. The contact element 9B may at least partly be made of an electrically conductive material too. For example, the die pad 9A and the contact element 9B may be made of the same material and may have been fabricated in one piece, i.e. formed integrally.

The semiconductor device 400 may further include a power semiconductor chip 3, for example a transistor chip, arranged over or mounted on the die pad 9A. A surface of the transistor chip 3 facing away from the die pad 9A may be defined as a top side of the transistor chip 3, and a surface opposite to the top side may be defined as a bottom side of the transistor chip 3. The bottom side of the transistor chip 3 may represent a drain electrode (not illustrated) and the top side of the transistor chip 3 may include a gate electrode 7 and a source electrode 8.

The transistor chip 3 may be mounted with its bottom side on the die pad 9A. Since the die pad 9A and the contact element 9B may be electrically coupled, it may be possible to contact the drain electrode of the transistor chip 3 via the contact element 9B. The semiconductor device 400 may include two further contact elements 10, 11 that may be formed as terminal legs. The contact elements 10, 11 may at least partly be made of an electrically conductive material, for example a metal or a metal alloy. In one example, the material of the contact elements 10, 11 may be similar to or may coincide with the material of the die pad 9 and/or the contact element 9B.

The transistor chip 3 may be at least partly encapsulated by an encapsulation material 12 (see dashed line), wherein the three contact elements 9B, 10 and 11 may protrude out of the encapsulation material 12. The contact elements 9B, 10 and 11 may provide an electrical connection to external applications (not illustrated) that may be configured to use the transistor chip 3. The contact element 9B may constitute the drain terminal and the two other contact elements 10 and 11 may be connected to the gate electrode 7 and the source electrode 8, respectively, by means of wires 13. In particular, an electrical signal received from an external application at the contact element 10 may control a current between the source electrode 8 and the drain electrode (not illustrated) of the transistor chip 3. For example, the electrical signal may be a voltage signal ranging from about 2 Volts to about 4 Volts.

Figure 5:
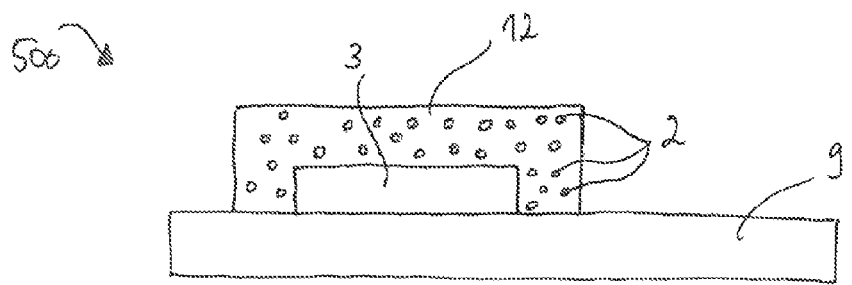
FIG. 5 schematically illustrates a cross-sectional view of a semiconductor device according to an embodiment.

FIG. 5 schematically illustrates a cross-sectional view of a semiconductor device 500 in accordance with an embodiment. The encapsulation material 12 of the semiconductor device 500 may include a material 2 for reversibly absorbing thermal energy. For example, the molecules of the material 2 may be homogeneously distributed in the encapsulation material 12, wherein the material 2 may have a concentration depending on temperatures that may occur during an operation of the semiconductor device 500. Alternatively or additionally, the molecules of the material 2 may be grouped in particles as indicated in FIG. 5. Each particle may include multiple molecules and may be coated by a material that may include at least one of a polyimide, a silane, a silicone, an epoxide, an acrylic resin, and mixtures thereof. The particles including the material 2 may particularly have a diameter similar to a diameter of particles of the encapsulation material 12. For example, a diameter of the particles may range from about 5 μm (micrometers) to about 100 μm (micrometers). The material 2 may e.g. be added to the encapsulation material 12 before the semiconductor chip 3 is encapsulated by the encapsulation material. For example, an encapsulation of the semiconductor chip 3 may be performed on wafer level.

Due to an absorption of thermal energy by the material 2, the semiconductor device 500 and its components may operate on a lower temperature compared to a semiconductor device not including the material 2, for example the semiconductor device 400 of FIG. 4, during similar operating steps. An arrangement of the material 2 in an encapsulation material 12 may particularly be suitable for absorbing thermal energy during smaller and slower temperature changes in the semiconductor device, for example a temperature increase by a value lying in a range from e.g. about 20° C. to about 100° C. in e.g. multiple seconds or multiple minutes.

Figure 6:
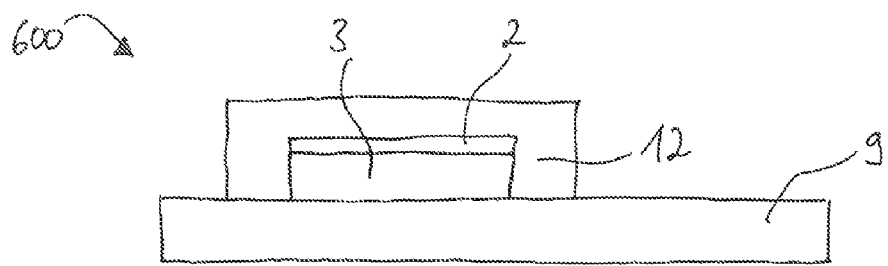
FIG. 6 schematically illustrates a cross-sectional view of a semiconductor device according to an embodiment.

FIG. 6 schematically illustrates a cross-sectional view of a semiconductor device 600 according to an embodiment. Compared to the semiconductor device 400, the semiconductor device 600 may additionally include a material 2 including molecules that may be configured to absorb thermal energy by reversibly changing a spatial molecular structure of the molecules. The material 2 may be arranged over a main surface of the semiconductor chip 3 that may particularly face away from the carrier 9. In particular, the material 2 may be arranged over a passivation layer arranged on the front side of the semiconductor chip 2. The material 2 may be opened at specific positions in order to expose electrical contact pads that may be arranged on the main surface of the semiconductor chip 3. In an exemplary case of a power semiconductor chip, the main surface of the semiconductor chip 2 facing away from the carrier 9 may include a source electrode and a drain electrode.

For example, the material 2 may be deposited as a layer over the main surface of the semiconductor chip 3 on wafer level. Any suitable technique may be used for depositing the material 2, for example a printing technique (e.g. including an ink jet process), a dispensing technique, etc. The molecules of the material 2 may be homogeneously distributed in the deposited layer and may have an concentration depending on temperatures at which the semiconductor device 600 may operate.

Alternatively or additionally, the molecules of the material 2 may be grouped in particles similar to FIG. 5. Again, each particle may include multiple molecules and may be coated by a material that may include at least one of a polyimide, a silane, a silicone, an epoxide, an acrylic resin, and mixtures thereof. The particles including the material 2 may particularly have a diameter in a range from about 100 nanometers to about 20 μm (micrometers). A thickness of the deposited layer may depend on the magnitude of thermal energies that may be generated during an operation of the semiconductor device 600. For example, a thickness of the deposited layer may lie in a range from about 100 nanometers to about 50 μm (micrometers), more particular from about 1 μm (micrometer) to about 10 μm (micrometers).

Due to an employment of the material 2 for reversibly absorbing thermal energy, the semiconductor device 600 and its components may operate on a lower temperature compared to semiconductor devices not including the material 2. An arrangement of the material 2 over a main surface of the semiconductor chip 3 may particularly be suitable for absorbing thermal energy generated during large and fast temperature changes, for example, temperature increases of e.g. about 200° C. in e.g. about 1 millisecond.

Figure 7:
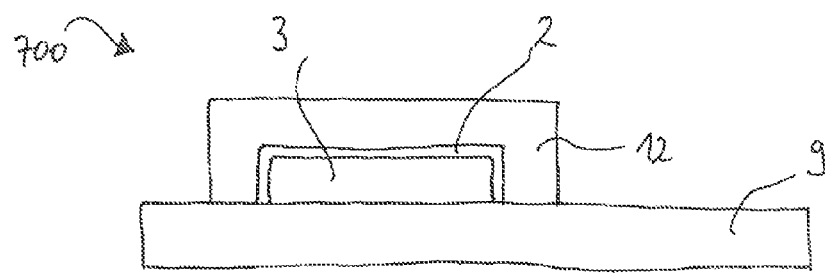
FIG. 7 schematically illustrates a cross-sectional view of a semiconductor device according to an embodiment.

FIG. 7 schematically illustrates a cross-sectional view of a semiconductor device 700 according to an embodiment. Here, the material 2 for reversibly absorbing thermal energy may be arranged over a main surface of the semiconductor chip 3 facing away from the carrier 9 and also over side walls of the semiconductor chip 3. In particular, the material 2 may be arranged over one or more selected side walls at which localized temperature increases may occur.

Figure 8:
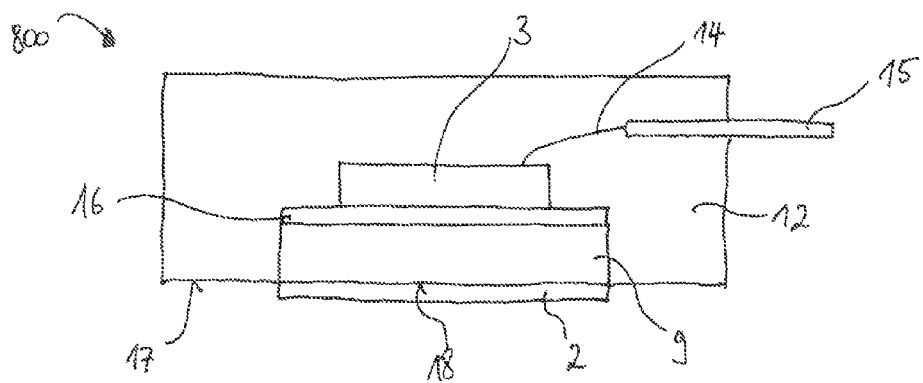
FIG. 8 schematically illustrates a cross-sectional view of a semiconductor device according to an embodiment.

FIG. 8 schematically illustrates a cross-sectional view of a semiconductor device 800 according to an embodiment. Comments made in connection with previously described figures may also hold true for FIG. 8. The semiconductor device 800 may include a semiconductor chip 3 that may be arranged over a carrier 9. For example, the semiconductor chip 3 may be a power semiconductor chip having a gate electrode and a source electrode that may be arranged on a main surface facing away from the carrier 9. In addition, the power semiconductor chip may include a drain electrode that may be arranged on a main surface facing the carrier 9. The electrodes may be contacted by external components (not illustrated) via contact elements, for example one or more wires 14 and one or more contact pins 15. In FIG. 8, only one wire and one pin is illustrated due to the chosen perspective. A possible arrangement of the electrodes (gate, source, drain) and associated electrical connections may be derived from FIGS. 4A and 4B, for example.

The semiconductor chip 3 may be coupled to the carrier 9 by a conductive layer 16 that may be fabricated from an electrically conductive material, for example a solder material. The drain electrode arranged on the main surface of the semiconductor chip 3 facing the carrier 9 may be electrically contacted via the conductive layer 16 and/or via further components which are not illustrated for the sake of simplicity. The semiconductor device 800 may further include an encapsulation material 12 that may at least partly encapsulate the semiconductor chip 3 and/or one or more further components of the semiconductor device 800. Components configured to provide an electrical connection between the semiconductor chip 3 and external components may protrude out of the encapsulation material 12, for example the pin 15. A surface 17 of the encapsulation material 12 may be flush with a surface 18 of the carrier 9.

The semiconductor device 800 may further include a material layer 2 that may include molecules that may be configured to absorb thermal energy by reversibly changing a spatial molecular structure of the molecules. The material layer 2 may be arranged over a backside of the semiconductor device 800, in particular over the surface 18 of the carrier 9 facing away from the semiconductor chip 3 and being flush with the surface 17 of the encapsulation material 12. The material layer 2 may partly cover the surface 18 of the carrier 9. In another example, the material layer 2 may fully cover the surface 18 of the carrier 9. In addition, the material layer 2 may at least partly cover the surface 17 of the encapsulation material 12. The material layer 2 may be similar to previously described materials for reversibly absorbing thermal energy. The material layer 2 may have a thickness, for example ranging from about 5 μm (micrometers) to about 500 μm (micrometers).

Figure 9:
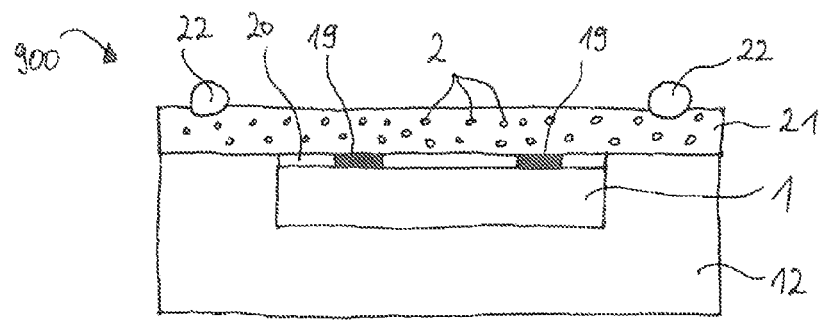
FIG. 9 schematically illustrates a cross-sectional view of a semiconductor device according to an embodiment.

FIG. 9 schematically illustrates a cross-sectional view of a semiconductor device 900 according to an embodiment. The semiconductor device 900 may include a semiconductor chip 1 that may have a passivation layer 20 and contact pads 19 that may be arranged in the passivation layer 20. The semiconductor chip 1 may be embedded in an encapsulation material 12, wherein a main surface of the semiconductor chip 1 including the passivation layer 20 may be flush with a main surface of the encapsulation material 12.

The semiconductor device 900 may further include a redistribution layer 21 that may be arranged over the semiconductor chip 1 and over the encapsulation material 12. The redistribution layer 21 may include one or more dielectric layers and one or more electrically conductive layers as already described above. In FIG. 9, a detailed illustration of the inner structure of the redistribution layer is omitted for the sake of simplicity. The redistribution layer 21 may be configured to provide an electrical connection between the contact pads 19 of the semiconductor chip 1 and external electrical contact elements 22, e.g. solder balls that may be arranged over the redistribution layer 21. The external electrical contact elements 22 may be configured to provide an electrical connection between the semiconductor device 900 and an external component (not illustrated). For example, the electrical contact elements 22 may be used for mounting the semiconductor device 800 on a Printed Circuit Board.

The redistribution layer 21 may include a material 2 for reversibly absorbing thermal energy. In FIG. 9, the material 2 is indicated by small circles. However, this exemplary illustration is in no way limiting. The material 2 may be included in the redistribution layer 21 in various ways. For example, the molecules of the material 2 may be included in one or more electrically insulating layers of the redistribution layer 21. Here, the material 2 may be homogeneously distributed in the electrically insulating layers in concentrations depending on a temperature at which the semiconductor device 900 may operate. Alternatively, the molecules of the material 2 may be grouped in particles as already described in connection with foregoing figures.

Figure 10:
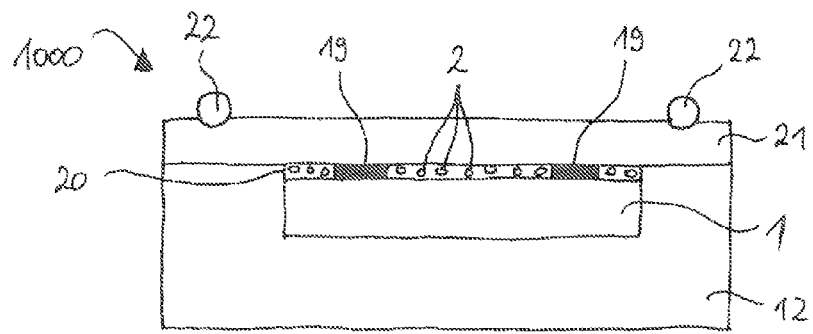
FIG. 10 schematically illustrates a cross-sectional view of a semiconductor device according to an embodiment.

FIG. 10 schematically illustrates a cross-sectional view of a semiconductor device 1000 according to an embodiment. The semiconductor device 1000 may be similar to the semiconductor device 900 of FIG. 9 such that comments made in connection with FIG. 9 may also hold true for FIG. 10. In FIG. 10, the passivation layer 20 may include a material 2 for reversibly absorbing thermal energy. For example, the material 2 may be homogeneously distributed in the passivation layer 20 having a concentration which may depend on temperatures at which the semiconductor device 1000 is configured to operate. Alternatively, molecules of the material 2 may be grouped in particles as described in connection with foregoing figures.

That the features of the described semiconductor devices in accordance with the disclosure may be combined in many different ways. For example, in a further exemplary semiconductor device in accordance with the disclosure, the material for reversibly absorbing thermal energy may be included in an encapsulation material and in a redistribution layer at the same time. In another example, the material for reversibly absorbing thermal energy may be deposited over a main surface of the semiconductor chip as e.g. described in connection with FIG. 6 and may further be embedded in an encapsulation layer as e.g. described in connection with FIG. 5. Multiple further semiconductor devices in accordance with the disclosure based on combinations of previously described semiconductor devices may be provided which are not explicitly described for the sake of simplicity.

The described semiconductor devices including a material for reversibly absorbing thermal energy may provide additional components or features for absorbing thermal energy. For example, included encapsulation materials may be chosen to have a high thermal conductivity or the semiconductor device may include one or more heat sinks.

While a particular feature or aspect of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific aspects have been illustrated and described herein, those of ordinary skill in the art will appreciate that a variety of alternate and/or equivalent implementations may be substituted for the specific aspects shown and described without departing from the scope of the present disclosure. This application is intended to cover any adaptations or variations of the specific aspects discussed herein. Therefore, it is intended that this disclosure be limited only by the claims and the equivalents thereof.

What is claimed is:

1. A semiconductor device, comprising:
    a semiconductor chip; and
    a first material comprising molecules that are configured to absorb thermal energy by reversibly changing a spatial molecular structure of the molecules,
    wherein changing the spatial molecular structure comprises a transition from a first isomer of the molecules to a second isomer of the molecules,
    wherein the semiconductor chip comprises a power semiconductor chip.

2. The semiconductor device of claim 1, wherein changing the spatial molecular structure comprises at least one of:
    a transition from a first configurational isomer of the molecules to a second configurational isomer of the molecules; and
    a transition from a first conformational isomer of the molecules to a second conformational isomer of the molecules.

3. The semiconductor device of claim 1, wherein the semiconductor chip comprises a surface comprising an electrical contact, and the first material is arranged over the surface.

4. The semiconductor device of claim 3, further comprising:
    a layer arranged over the surface, wherein the layer comprises the first material, and a thickness of the layer lies in a range from 100 nanometers to 50 micrometers.

5. The semiconductor device of claim 3, wherein the first material comprises particles, wherein each particle comprises multiple of the molecules, and each particle has a diameter in a range from 100 nanometers to 20 micrometers.

6. The semiconductor device of claim 1, further comprising:
    an encapsulation material at least partly encapsulating the semiconductor chip, wherein the encapsulation material comprises the first material.

7. The semiconductor device of claim 6, wherein the first material comprises particles, wherein each particle comprises multiple of the molecules, and each particle has a diameter in a range from 5 micrometers to 100 micrometers.

8. The semiconductor device of claim 1, wherein the semiconductor chip comprises a passivation layer, wherein a contact pad is embedded in the passivation layer, the contact pad providing an electrical connection to an integrated circuit of the semiconductor chip, and wherein the passivation layer comprises the first material.

9. The semiconductor device of claim 1, further comprising:
    a redistribution layer arranged over the semiconductor chip, wherein the redistribution layer comprises the first material.

10. The semiconductor device of claim 1, further comprising:
    a carrier, wherein the semiconductor chip is arranged over the carrier;
    an encapsulation material at least partly encapsulating the semiconductor chip, wherein a surface of the carrier is flush with a surface of the encapsulation material; and
    a material layer arranged over the surface of the carrier, wherein the material layer comprises the first material.

11. The semiconductor device of claim 10, wherein the material layer has a thickness in a range from 5 micrometers to 500 micrometers.

12. The semiconductor device of claim 1, wherein the first material comprises particles, wherein each particle comprises multiple of the molecules, and each particle is coated with a second material comprising at least one of a polyimide, a silane, a silicone, an epoxide, an acrylic resin, and mixtures thereof.

13. The semiconductor device of claim 1, wherein the first material comprises at least one of a 1-ethyl-4-[4-methoxy-styryl]-quinolinium compound, a cis-stilbazolium betaine, an N,N-dialkylamino-styrene dye, a stilbene, a porphyrin, a norbornadiene, a spiro compound, and an azo compound.

14. The semiconductor device of claim 1, wherein the spatial molecular structure is reversibly changed at a temperature in a range from 150° C. to 400° C.

15. The semiconductor device of claim 1, wherein a molecular formula of the first isomer is identical to a molecular formula of the second isomer, and wherein a structural formula of the first isomer differs from a structural formula of the second isomer.

16. A semiconductor device, comprising:
    a power semiconductor chip comprising a first surface and a second surface opposite the first surface, wherein the first surface comprises a drain, and the second surface comprises a gate and a source; and
    a material arranged over second surface, wherein the material comprises molecules that are configured to absorb thermal energy by reversibly changing a spatial molecular structure of the molecules.

17. The semiconductor device of claim 16, wherein changing the spatial molecular structure comprises a transition from a first isomer of the molecules to a second isomer of the molecules.

18. A semiconductor device, comprising:
    a semiconductor chip; and
    a first material comprising molecules that are configured to absorb thermal energy by reversibly changing a spatial molecular structure of the molecules, and
    a redistribution layer arranged over the semiconductor chip, wherein the redistribution layer comprises the first material.

19. A semiconductor device, comprising:
    a semiconductor chip;
    a first material comprising molecules that are configured to absorb thermal energy by reversibly changing a spatial molecular structure of the molecules, and
    an encapsulation material at least partly encapsulating the semiconductor chip, wherein the encapsulation material comprises the first material,
    wherein changing the spatial molecular structure comprises a transition from a first isomer of the molecules to a second isomer of the molecules.

* * * * *

UNITED STATES PATENT AND TRADEMARK OFFICE
CERTIFICATE OF CORRECTION

| | | |
|---|---|---|
| PATENT NO. | : 9,165,847 B2 | Page 1 of 1 |
| APPLICATION NO. | : 13/866150 | |
| DATED | : October 20, 2015 | |
| INVENTOR(S) | : J. Mahler et al. | |

It is certified that error appears in the above-identified patent and that said Letters Patent is hereby corrected as shown below:

Claims

Column 14, line 35 (claim 16, line 6) please change "over second" to -- over the second --

Signed and Sealed this
Twenty-ninth Day of March, 2016

Michelle K. Lee
*Director of the United States Patent and Trademark Office*